(12) United States Patent
Selvamanickam

(10) Patent No.: US 8,119,187 B2
(45) Date of Patent: Feb. 21, 2012

(54) CHEMICAL VAPOR DEPOSITION PROCESS USING NOVEL PRECURSORS

(75) Inventor: Venkat Selvamanickam, Wynantskill, NY (US)

(73) Assignee: Superpower, Inc., Schenectady, NY (US)

( * ) Notice: Subject to any disclaimer, the term of this patent is extended or adjusted under 35 U.S.C. 154(b) by 767 days.

(21) Appl. No.: 10/736,210

(22) Filed: Dec. 15, 2003

(65) Prior Publication Data

US 2005/0129966 A1    Jun. 16, 2005

(51) Int. Cl.
*B05D 5/12* (2006.01)
*C23C 16/00* (2006.01)
*H01L 39/24* (2006.01)

(52) U.S. Cl. ............... 427/62; 427/255.31; 427/255.33; 29/599; 505/447; 505/473

(58) Field of Classification Search ............... 427/250, 427/255.29, 255.31, 255.32, 62; 29/599; 505/447, 473

See application file for complete search history.

(56) References Cited

U.S. PATENT DOCUMENTS

| 5,021,658 | A | * | 6/1991 | Bluzer | 250/336.2 |
| 5,126,668 | A | * | 6/1992 | Nojima et al. | 324/248 |
| 5,157,015 | A | * | 10/1992 | Snyder et al. | 505/401 |
| 5,231,074 | A | * | 7/1993 | Cima et al. | 505/434 |
| 5,268,354 | A | * | 12/1993 | Blanchet-Fincher et al. | 505/470 |
| 5,908,507 | A | * | 6/1999 | Onabe et al. | 118/718 |
| 6,193,911 | B1 | * | 2/2001 | Hunt et al. | 252/518.1 |
| 6,338,809 | B1 | * | 1/2002 | Hampden-Smith et al. | 264/7 |
| 6,562,761 | B1 | * | 5/2003 | Fritzemeier et al. | 505/510 |

FOREIGN PATENT DOCUMENTS

| JP | 01-164729 | * | 6/1989 |
| JP | 01-246133 | * | 10/1989 |
| JP | 03-265507 | * | 11/1991 |
| JP | 04-077302 | * | 3/1992 |
| JP | 04-325405 | * | 11/1992 |

* cited by examiner

*Primary Examiner* — Brian K Talbot
(74) *Attorney, Agent, or Firm* — Abel Law Group, LLP

(57) ABSTRACT

In a chemical vapor deposition process simple precursors such as a rare earth nitrate or acetate, Ba-nitrate or acetate and Cu-nitrate or acetate are dissolved in an appropriate solvent, preferably water, to form a solution, nebulized into a fine mist and applied to a substrate.

20 Claims, 3 Drawing Sheets

Inductive transition temperature measurement

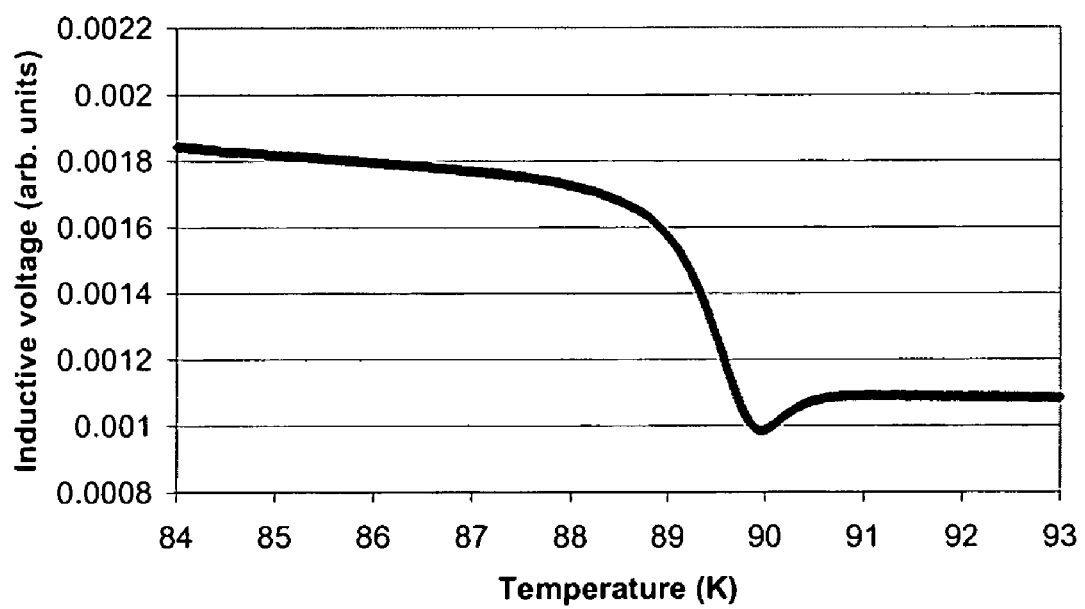
Figure 1 Inductive transition temperature measurement

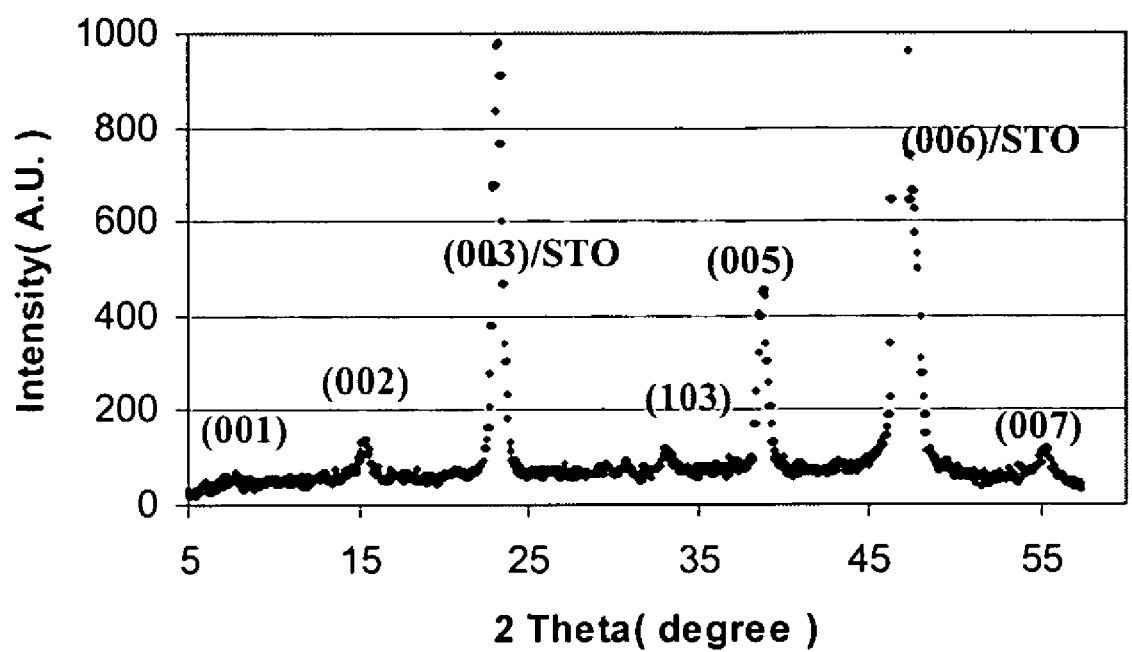
Figure 2  Theta-2theta X-ray Diffraction data

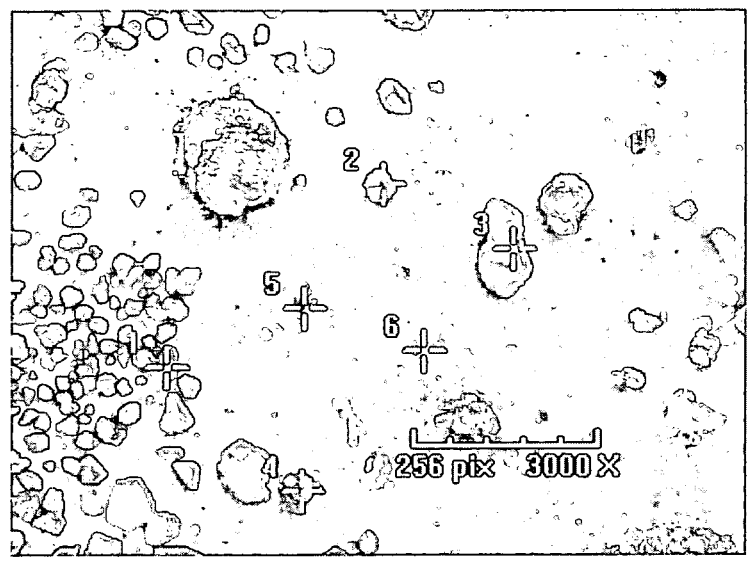
| Tag | Y | Ba | Cu | O | Sr | Ti |
|---|---|---|---|---|---|---|
| 1 | 0.67% | 0.66% | 9.67% | 28.52% | 45.22% | 15.26% |
| 2 | 0.26% | 0.49% | 15.56% | 15.79% | 43.62% | 24.29% |
| 3 | 0.27% | 0.61% | 11.60% | 35.60% | 32.87% | 19.06% |
| 4 | 0.48% | 1.18% | 10.68% | 28.09% | 37.34% | 22.23% |
| 5 | 1.37% | 2.22% | 4.58% | 27.14% | 45.08% | 19.62% |
| 6 | 1.52% | 2.93% | 4.92% | 32.90% | 42.17% | 15.57% |
Figure 3 Scanning Electron Micrograph (SEM) and Energy Dispersive Analysis (EDS) of a YBCO film

CHEMICAL VAPOR DEPOSITION PROCESS USING NOVEL PRECURSORS

BACKGROUND

Metal Organic Chemical Vapor Deposition (MOCVD) is a viable process for producing second generation high temperature superconducting (HTS) tapes. MOCVD processes have been used to produce YBCO tapes up to 18 meters long with an end-to-end critical current performance of 111 A. MOCVD offers several advantages over competing processes used to produce HTS tapes.

The main advantage offered by MOCVD is that of high throughput. MOCVD processes have the advantage of a high deposition rate (about 1 micron/minute) coupled with deposition zones that are flexibility in their length. Since the deposition zone in a MOCVD process can be as long and as wide as the coating delivery means, typically a showerhead, the deposition zone is, in essence, unlimited.

This combination of high deposition rate and long deposition zone leads to high throughput. Other advantages of MOCVD include preparation of precursors outside the deposition chamber, which allows continuous provision of precursors very easy for long production runs, non line-of-sight coating which can enable double-sided deposition, absence of high-vacuum pumping, and no target fabrication expense.

These benefits and the increase in interest in producing oxide superconducting, ferroelectric, and dielectric materials are the reason MOCVD technology has demonstrated significant growth in the past two decades. These oxide compounds, with the exception of simple dielectrics such as $SiO_2$ and $Ta_2O_5$, tend to be complex in composition and structure. They often involve metallic elements with wide-ranging size, electronegativity, and oxidation states that necessarily require complex organic ligands to form volatile, yet thermally stable, precursor compounds. Consequently, the method of precursor delivery, as well as the type of deposition reactions, may vary drastically between components for any multicomponent oxide.

The characteristics of oxide films deposited with MOCVD processes are highly dependant on the selection of precursor compounds, deposition temperature, deposition environment, and kinetic factors such as the precursor partial pressure and flow rate.

Metalorganic compounds suitable as precursors for most main-group and transition-metal elements are now readily available from commercial sources. There are four categories of metalorganic compounds frequently used: β-diketonates, such as 2,2,6,6-tetramethyl-3,5-heptanedionate (thd) and 2,4-pentanedionate (also known as acetylacetonate, acac); alkoxides, such as ethoxide, isopropoxide, and butoxide; alkylmetals, such as ethylzinc and phenylbismuth; and carboxylates, such as benzoate and ethylhexanoate (eha).

β-diketonates are readily prepared by directly refluxing the respective β-diketones with lower alkoxides of the metal element in appropriate solvent. One detriment associated with most common β-diketonate precursors is the need to perform the depositions at reduced pressure, typically ranging from about 1 torr to 25 torr, due to the low volatility of the precursor. Thus, it would be desirable to utilize a precursor with a volatility sufficiently high to permit high pressure or atmospheric pressure vapor deposition.

The vapor pressure of precursor compounds at various temperatures has far-reaching consequences for the quality of the deposited coating. A key aspect in the use of multicomponent precursors in the deposition of oxide coatings is the control of the composition of the precursors in the vapor phase. Since the majority of the oxide systems of present interest have melting points much higher than the typical deposition temperature, insufficient diffusion results in non-equilibrium depositions. Consequently, the composition of the deposited films is highly dependent on the individual precursor partial pressure immediately above the substrate surface.

Liquid precursor delivery systems are commercially available for MOCVD applications. By dissolving the precursors in appropriate solvents and at appropriate concentration, metalorganic precursors with low volatility and poor thermal stability can be accommodated. Such a liquid-injection method is similar to spray pyrolysis in that the composition of the vapor-phase species can be prescribed to a certain degree. The general applicability of such liquid-delivery evaporation systems has been demonstrated for oxide systems such as $BaTiO_3$, $YBa_2Cu_3O_{7-d}$, YSZ, $LaSrCoO_3$, and copper using mixtures of respective precursors in the solution.

It should be recognized that, between the preferred characteristics of high volatility and high thermal stability, difficulty remains in identifying appropriate metalorganic compounds as precursors. Liquid injection and flash evaporators are important advances because a wider variety of metalorganic compounds can now be used in the MOCVD of oxides. However, those techniques are limited to precursors that have sufficient solubility in appropriate solvents. In addition, when liquid is directly injected on a substrate surface, the uniformity and the density of the layer, and ultimately the compositional and structural perfection of the deposited layer, have been hard to control.

The precursor compound must deliver metallic elements to the substrate deposition zone at a precisely controlled, constant dosage. The precursor should play an active role in regulating the relative ratio between metal elements, and the single-precursor approach is an important step in that direction.

Finally, the precursor compound should permit at least one reaction mechanism through which a clean deposition reaction with little contamination can be carried out.

A significant drawback of MOCVD to the utilization of the commonly used tetramethyl heptanedionate (thd) precursors is the cost; typically the cost of the thd precursors is about $10 to $15/g for quantities of 100 g, which is sufficient to produce about ten meters of coated substrate tape. With increased production volume per coating run from the current 10 m to the expected few thousand kilometers, the cost is expected to be reduced by an order of magnitude. The order-of-magnitude reduction in precursor cost is expected to be sufficient to reach a cost goal of $10/kA-m. Even so, the precursor cost will be a significant contributor to the overall cost of the HTS material.

Therefore, it would be beneficial if precursors other than the typical thd precursors could be used to produce high quality second generation HTS tapes. If a chemical vapor deposition process and apparatus were developed using such alternate precursors, then a) the cost goal of $10/kA-m could potentially be reached with a smaller production volume, in which case widespread use of second generation tapes can be achieved at an earlier time frame and b) reliance on thd-based precursor manufacturers to reduce the cost would not be necessary.

It is thus an object of this invention to provide a chemical vapor deposition based on precursors alternate to thd.

These objects and other features, aspects, and advantages of the present disclosed embodiments will become better understood when the following detailed description is read with reference to the accompanying drawings.

SUMMARY OF THE INVENTION

In a chemical vapor deposition process simple precursors such as Y-nitrate or acetate, Ba-nitrate or acetate and Cu-nitrate or acetate are dissolved in an appropriate solvent, desirably water, to form a solution and applied to the substrate using a new delivery system. The solution is not vaporized. Rather, it is nebulized into fine mist where the mean diameter size is smaller than 20 microns. The novel precursors replace conventional tetramethyl heptanedionate precursors.

BRIEF DESCRIPTION OF THE DRAWINGS

Like characters represent like parts throughout the figures, wherein:

FIG. 1 shows the inductive transition temperature of a YBCO film deposited by CVD by an embodiment of the disclosed process.

FIG. 2 shows X-ray diffraction data obtained from a YBCO film deposited by CVD by an embodiment of the disclosed process.

FIG. 3 depicts the results of a microscopy and composition analysis using Scanning Electron Microscope (SEM) and Energy Dispersive X-ray Spectroscopy (EDS).

DESCRIPTION OF THE INVENTION

Most MOCVD processes developed for HTS use β-diketonate, typically tetramethyl heptanedionate (thd), precursors. In a typical implementation of the MOCVD process for the production of HTS tapes, Y-thd, Ba-thd, and Cu-thd are used. Appropriate quantities of these precursors are dissolved in organic solvents and the solution is pumped into a vaporizer where it is flash vaporized. The metal-organic vapors are carried downstream in an inert carrier gas such as argon. Oxygen is then added and the mixture is sprayed from a showerhead onto a heated substrate tape, which is maintained at subatmospheric pressure conditions.

It has now been determined that simple precursors such as nitrates and acetates can be used instead of thd. Y-nitrate or acetate, Ba-nitrate or acetate and Cu-nitrate or acetate is dissolved in an appropriate solvent, preferably at a concentration of from about 0.01 to about 5 mole, preferably from about 0.05 to about 1 mole in a suitable solvent such as water, to form a solution. Instead of vaporizing the solution as in conventional systems, a fine mist is formed where the mean diameter size is in the range of from about 1 to about 100 microns, preferably with a mean diameter smaller than 20 microns.

It is convenient to utilize an ultrasonic nebulizer or micronebulizer to obtain the fine particle size required, but any other convention means of producing a fine mist may be used.

The substitution of the nitrate or acetate salts of the desired metals occasions few if any modifications to the conventional MOCVD process, in that the mist is carried in stream of argon, mixed with oxygen and the mixture is contacted with the surface of a substrate to be coated in the normal manner. One convenient and a preferred method of contacting the substrate with the mist of precursors is to deliver the precursors to the deposition zone through a showerhead delivery apparatus, although any delivery means that is capable of delivering an even mist of the precursor solution on the substrate may be used.

Solvent in the precursor mist is first evaporated after which the acetates or nitrates in the precursor mist are decomposed at an elevated temperature between the heated substrate and the precursor delivery line. Decomposed precursor forms $YBa_2Cu_3O_{7-d}$ film atop of the substrate heated to a temperature in the range of from about 750° C. to about 900° C. at a controlled atmosphere in the range of from about 1 to about 760, preferably from about 10 to about 500, most preferably in the range of from about 20 to about 250 Torr of chamber pressure and in the range of from about 0.5 to about 300 Torr of oxygen partial pressure.

In an alternate embodiment not utilizing a showerhead, an inert assisting gas may be used to conform the vapor stream to a desired shape and to focus the precursor vapor onto the substrate to be coated.

The substrate may be any conventional substrate. Alloys of nickel, chromium, iron, copper, and silver are preferred and nickel based alloys are most preferred.

As in the case of the current MOCVD processes, the deposition is preferably conducted under subatmospheric pressure conditions; however atmospheric-pressure deposition is also possible for the novel CVD process using nitrate and acetate salts of the desired metals as the precursors.

An additional advantage of the new system over current MOCVD processes is that the precursor delivery lines need not be maintained at an elevated temperature since the precursors are not in the vapor phase and condensation is not a concern. The length of the delivery line of the precursors does however need to be minimized in order to avoid growth in the droplet size of the precursor mist.

EXAMPLE 1

HTS films were deposited on single crystal $SrTiO_3$ substrates using the CVD process disclosed in this invention.

Precursor solutions were prepared by dissolving 0.73 g of yttrium nitrate in 15 ml of water, 1.38 g of barium nitrate in 20 ml of water, and 0.24 g of copper nitrate in 15 ml of water. The solutions were mixed together and pumped at a rate of 0.2 to 0.4 mL/min into an ultrasonic mist generator which was powered at 5 W.

The deposition chamber was constructed using a stainless steel vacuum vessel with ports for supplying precursors, pumping exhaust as well as for monitoring process parameters such as temperature, pressure, and oxygen content. A resistive substrate heater was provided for heating substrates. The chamber had a viewport for monitoring the substrate condition during deposition and a provision for adding chambers for reel-to-reel operation for continuous tape processing.

Single crystal $SrTiO_2$ substrates were introduced into a deposition chamber and heated to 800 C. The reactor pressure was 50 Torr.

The mist was delivered through a vapor column and mixed with oxygen gas at a flow rate of 50 sccm. Deposition time was 1 hour.

The deposited samples were then annealed in oxygen at 550 C for 1 hour.

After cooling to room temperature he samples were analyzed by scanning electron microscopy (SEM), and X-ray Diffraction (XRD). The transition temperature of the samples was measured by inductive measurement and critical current density was measured by the transport four-probe technique.

A superconducting transition temperature of 90 K has been achieved (FIG. 1). X-ray diffraction data obtained from the film show well c-axis textured YBCO phase (FIG. 2). Microscopy and composition analysis using Scanning Electron Microscope (SEM) and Energy Dispersive X-ray Spectroscopy (EDS) show areas with smooth film structure as well as a composition close to the superconducting composition of YBa$_2$Cu$_3$O$_x$ in those areas (tags 5 & 6 in FIG. 3). A critical current density (Jc) of 0.9×10$^5$ A/cm$^2$ was also demonstrated at 77 K.

The foregoing describes the invention in terms of embodiments foreseen by the inventor for which an enabling description was available, notwithstanding that insubstantial modifications of the invention, not presently foreseen, may nonetheless represent equivalents thereto.

The invention claimed is:

1. A chemical deposition process for the deposit of a rare earth-barium-copper oxide superconductor coating on a substrate, comprising:
    nebulizing into a fine mist precursors selected from the group consisting of the nitrates and acetates of a rare earth, barium and copper, wherein the precursors are dissolved in appropriate solvents to form a solution and the fine mist is composed of droplets; and
    applying the fine mist composed of said droplets onto a substrate heated at a temperature in the range of from 750° C. to about 900° C. in a deposition chamber maintained at a pressure of not greater than about 500 Torr whereby the fine mist of precursors decompose into the rare earth-barium-copper oxide superconductor coating on the substrate during applying the fine mist onto the substrate.

2. The process of claim 1 where the rare earth is yttrium.

3. The process of claim 1 where the solvent is water.

4. The process of claim 1 where the concentration of the precursor salts in the solvent ranges from about 0.01 mole/l to about 5 mole/l.

5. The process of claim 1 where the concentration of the precursor salts in the solvent ranges from about 0.05 mole/l to about 1 mole/l.

6. A chemical deposition process for the deposit of a rare earth-barium-copper oxide superconductor coating on a substrate, comprising:
    nebulizing into a fine mist precursors selected from the group consisting of the nitrates and acetates of a rare earth, barium and copper, wherein the precursors are dissolved in appropriate solvents to form a solution and the fine mist is composed of droplets; and
    applying the fine mist composed of said droplets onto a substrate heated at a temperature in the range of from 750° C. to about 900° C. in a deposition chamber maintained at a pressure of not greater than about 500 Torr, where the droplets of nebulized precursor solutions having a mean diameter size in the range of from about 1 to about 100 microns and the fine mist of precursors decompose into the rare earth-barium-copper oxide superconductor coating on the substrate during applying the fine mist onto the substrate.

7. The process of claim 6 where the droplets of nebulized precursor solutions have a mean diameter size of less than 20 microns.

8. The process of claim 1 where the precursor solutions are mixed together prior to nebulization.

9. The process of claim 1 where the precursor solutions are individually nebulized.

10. The process of claim 1 where the precursors are nitrates.

11. The process of claim 1 where the precursors are acetates.

12. The process of claim 1 where the substrate is selected from the group consisting of alloys of nickel, chromium, iron, copper, and silver.

13. The process of claim 1 where the substrate is nickel-based alloy.

14. The process of claim 1 where the nebulized mist is delivered to the deposition chamber through a vapor column.

15. The process of claim 13 where the mist is mixed with oxygen gas.

16. The process of claim 1 where the deposition chamber is maintained at a pressure of from about 10 Torr to about 500 Torr.

17. The process of claim 1 where the deposition chamber is maintained at a pressure of from about 20 Torr to about 250 Torr.

18. A process for producing a coated substrate having a c-axis textured YBCO phase and a superconducting transition temperature of at least 85 K comprising
    dissolving precursors selected from the group consisting of the nitrates and acetates of yttrium, barium and copper in appropriate solvents,
    mixing the resulting solutions,
    providing a substrate,
    heating the substrate to a temperature in the range of from about 750 C. to about 900 C. in a deposition chamber maintained at a pressure of not greater than about 500 Torr,
    nebulizing the mixed precursor solution into droplets,
    applying a nebulized mist of said droplets onto the substrate in the deposition chamber in the presence of oxygen for a period of time sufficient to form a YBCO coating on the substrate, and
    decomposing the nebulized mist of said droplets into the rare earth-barium-copper oxide superconductor coating during applying the nebulized mist of said droplets onto the substrate.

19. The product of the process of claim 1.

20. The product of the process of claim 18.

* * * * *